United States Patent [19]

Liebermann

[11] 4,213,089
[45] Jul. 15, 1980

[54] VARIABLE SCALE READOUT FOR MULTI-METER USE

[75] Inventor: Leonard N. Liebermann, La Jolla, Calif.

[73] Assignee: TIF Instruments, Inc., Miami, Fla.

[21] Appl. No.: 947,642

[22] Filed: Oct. 2, 1978

[51] Int. Cl.² ............................................. G01R 15/08
[52] U.S. Cl. .................................... 324/115; 116/292; 116/318
[58] Field of Search ................. 324/115, 116, 103 R; 116/292, 298, 300, 309, 316, 318; 74/412 R, 414; 235/113, 114

[56] References Cited

U.S. PATENT DOCUMENTS

| | | | |
|---|---|---|---|
| 2,004,724 | 6/1935 | Herzog | 324/115 |
| 2,466,558 | 4/1949 | Sadlon | 324/115 |
| 2,558,276 | 6/1951 | Simpson et al. | 324/115 |
| 3,092,072 | 6/1963 | Strimel | 324/115 |
| 3,434,453 | 3/1969 | Felgner | 116/300 |
| 3,829,775 | 8/1974 | Brock | 324/115 |
| 3,895,291 | 7/1975 | Friend | 324/115 |
| 3,978,404 | 8/1976 | Friend | 324/115 |

*Primary Examiner*—Rudolph V. Rolinec
*Assistant Examiner*—Ernest F. Karlsen
*Attorney, Agent, or Firm*—Pennie & Edmonds

[57] ABSTRACT

This invention provides an apparatus for adjusting the scale and range of D'Arsonval pointer-type meters providing an uncluttered accurate readout particularly adapted for compact hand-held meters. Display wheels imprinted with numerals for a plurality of different scales are provided enabling the user to set, by manual rotation of a drive gear engaging a ring gear one of a plurality of desired ranges. The invention also provides for the simultaneous automatic selection or interconnection of circuit elements for driving the meter movement in accordance with the selected range.

5 Claims, 4 Drawing Figures

VARIABLE SCALE READOUT FOR MULTI-METER USE

TECHNICAL FIELD

This invention relates generally to apparatus for selectively adjusting the scale of measuring instruments. Although suitable for use in any conventional meter, the invention is particularly useful in meters utilizing a D'Arsonval movement, i.e., pointer-type meters, for the measurement of an electrical variable such as resistance voltage, current power or the like. The variable scale readout of the invention is simple to assemble and of a compact rugged construction making it particularly adaptable to instruments intended for hand-held use in the field.

BACKGROUND ART

Meters providing for variable and selectable scale readout over a large range of parameters are well known in the prior art. These prior art meters are generally electrical measurement instruments and encompass meters limited to the measurement of a single parameter as well as meters capable of providing measurement of many parameters. Such prior art instruments have, however, presented a more or less cluttered appearance, causing the reader to momentarily confuse or misread the scales and thereby often affording the substantial opportunity for error in any individual reading or series of readings. Prior meter presentations have also tended to be inaccurate due to parallax error inherent in using a flat printed scale and due to the constant need to realign the zero point on the scale as scales are changed. In addition, many of these prior art meters tend to be bulky and less susceptible of portable hand-held operation due to complex mechanical linkages and the substantial amount of space occupied by the scale changing mechanism.

For example, the meter disclosed in U.S. Pat. No. 3,092,072 utilizes a single rotable circular plate on which is imprinted a sequence of numbers representing a range of parameters and is mechanically rotated by a rack and pinion arrangement to permit selected numerals to be sequentially visible through windows in the meter housing, masking other numerals. While permitting an arcuate readout, this meter has a limited number of ranges and scales which the operator may select from and is unsuitable for use in portable hand-held meters.

Among the various prior art meters, some provide for the simultaneous automatic selection of both the proper scale and the proper electrical circuit which operates the indicating movement. In general, selection is accomplished by activating a separate switch thus not affording direct coordination between the scale and the movement operating circuit. Those prior art devices which do provide for a simultaneous selection of both the proper scale and the corresponding movement operating circuit do not have the simplicity and rugged construction afforded by this invention. One example is the device disclosed in U.S. Pat. No. 3,829,775 requires the use of a servo-driven pointer and due to its use of a linear flat scale and its concomitant parallax error is incomptable for accurate measurements with a D'Arsonval movement. Furthermore, the complexity of the mechanical linkages and components to effect simultaneous selection makes this device unfeasible for low-cost manufacture, carefree maintenance and ease of hand-held operation. Another example is the device disclosed in U.S. Pat. No. 2,558,276 which requires a complex mechanical arrangement to convert the motion of the selector switch in one plate to move the scale carrying down in a perpendicular plane. Such an arrangement necessitates expensive precision assembly and is susceptible to malfunctions in the rugged environment of hand-held test instruments used in the field.

DISCLOSURE OF INVENTION

This invention provides an apparatus for adjusting the scale and range of D'Arsonval pointer-type meters providing uncluttered accurate readout while eliminating undue meter size. Apparatus is provided which enables the user to set a substantial number of desired ranges for a scale so as to make a particular measurement from an uncluttered meter with an arcuate readout. In one embodiment the invention comprises a housing, a meter plate supported by said housing with a plurality of display windows arranged in an arcuate configuration, a plurality of geared display wheels are mounted in non-engageable relation with each other and imprinted with scale numerals arranged sequentially about the display wheel face enabling the numerals to be brought into register with the windows on the meter plate to permit arcuate readout of a selected meter scale, a ring gear is rotatably mounted for engagement of the geared display wheels and a drive gear is rotatably mounted for engaging the ring gear such that rotation of the drive gear rotates the ring gear causing rotation of the display wheels such that the desired meter scale is set and can be read through the windows on the meter. Means are provided for manually rotating the drive gear. In this embodiment, the scale is changed by causing the drive means to rotate a drive gear which meshes with and rotates a ring gear which in turn meshes with and causes five display gears in a semicircular arrangement about the circumference of the ring gear, to rotate in unison so as to display through windows on the meter face, a set of numerals corresponding to the desired range of a scale. In another embodiment, means for electrical switching is provided in which the underside of the ring gear is provided with a set of metal contacts which correspond to electrical contacts directly beneath it on a printed circuit board. When the drive gear rotates the ring gear to obtain a scale on the meter face, the metal contacts on the ring gear simultaneously contact a prescribed set of electrical contacts on the printed circuit board corresponding to the electrical circuit required for measuring the property selected on the scale desired.

A feature of the invention is the use of a permanent zero point to maintain repeated accuracy in readout and to obviate the need for resetting the zero point after each change of range and scale.

An additional feature of the invention is the reduction in meter size and the compactness of packaging accomplished by the use of the overlapping non-engageable display gears over those scale displays of the prior art while providing an uncluttered readout display making this invention suitable for hand-held operation.

A further feature of the invention is its capability of providing for the simultaneous selection of both the proper scale and the associated proper electrical circuit using uncomplicated mechanical linkages, obviating the need for separate switching.

BRIEF DESCRIPTION OF THE DRAWINGS

The invention will be described in conjunction with the accompanying drawings, in which.

BEST MODE FOR CARRYING OUT THE INVENTION

Figure 1:
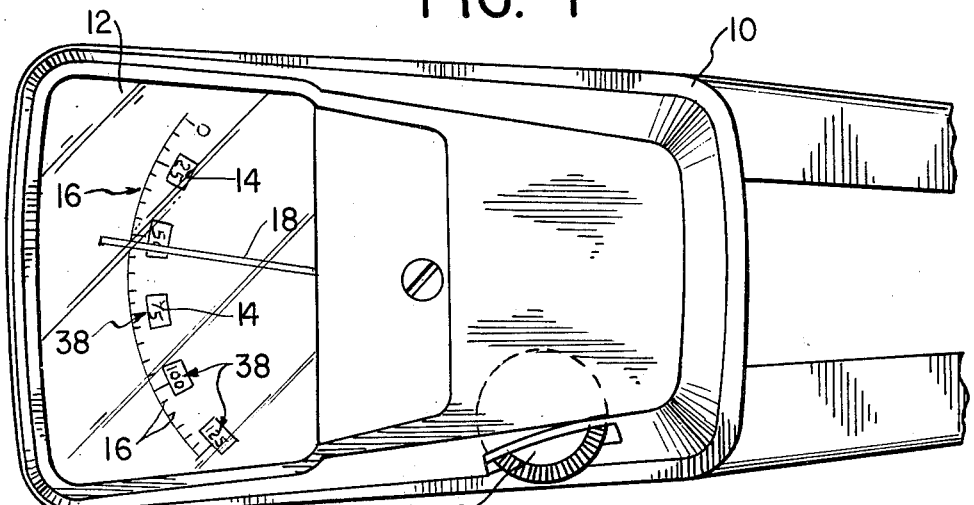
FIG. 1 is a plan view of one embodiment of the invention.

With reference to the figures, wherein like characters denote like parts throughout, a variable scale readout for use with a multi-meter comprises a housing 10, a printed circuit board 22, a thumb knob 20, a drive gear 24, a ring gear 26, five geared display wheels 36 with numerals 38 imprinted thereon, a meter face plate 12 with five windows, and a D'Arsonval movement 28 with a pointer 18.

The housing 10 shown in the figures may be constructed of any material suitable as a support for the elements comprising the variable scale mechanism and associated battery holder 44. Preferably all the elements excluding the D'Arsonval movement 28 the metal contact 50, and electrical contacts 52 may be formed of a durable molded plastic material affording ease of manufacture and assuring an inexpensive readily marketable device.

The meter face 12 as shown in FIG. 1 comprises a set of imprinted graduations 16 arranged in an arcuate configuration with five display windows arranged and spaced to permit the numerals 38 to appear at regular intervals along the graduations.

Figure 2:
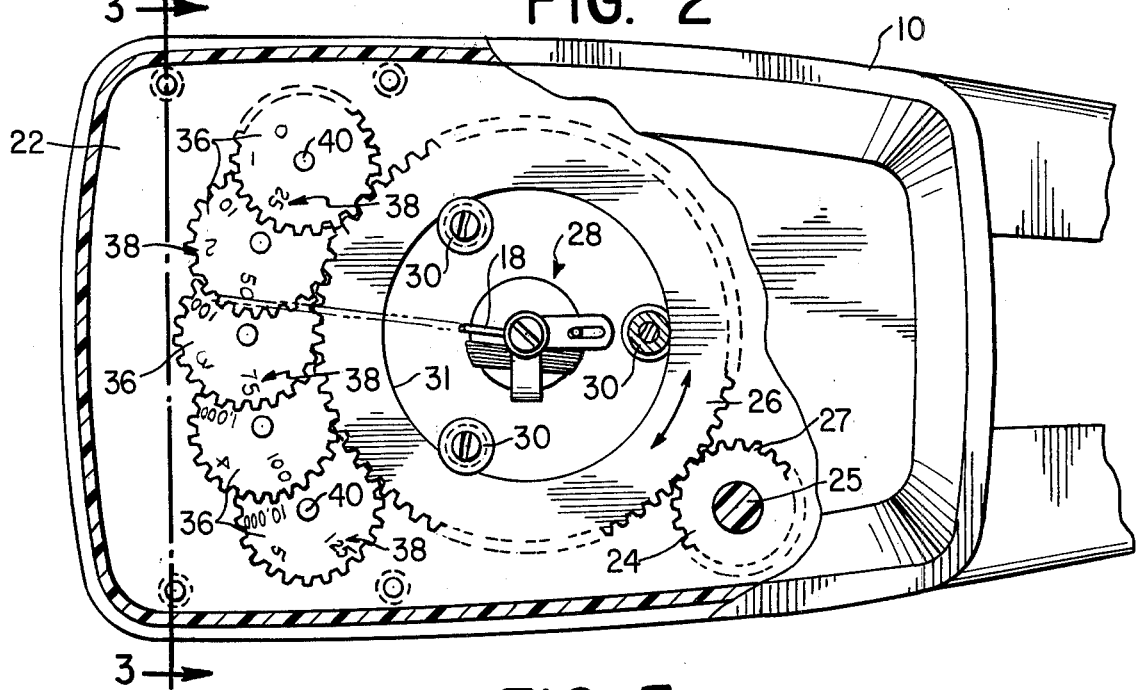
FIG. 2 is a transparent plan view, partly in section, of FIG. 1.
Figure 3:
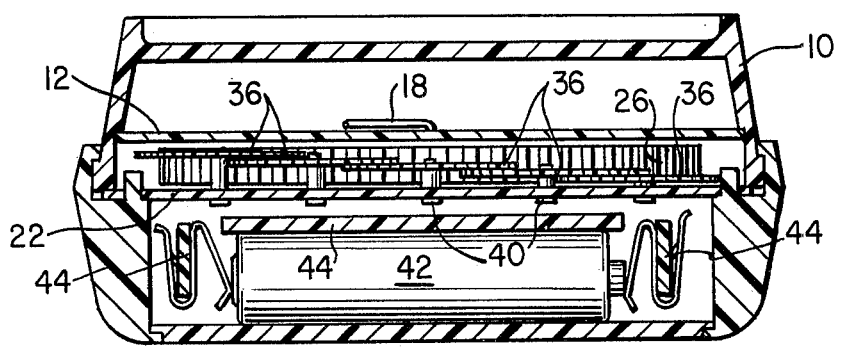
FIG. 3 is a sectional view of FIG. 2 on the line 3—3.

Directly beneath the meter face plate 12 are five geared display wheels 36 rotatably mounted by connecting means 40 to a printed circuit board 22 and arranged in an arcuate configuration about the circumference of the ring gear 26 in non-engageable overlapping relation to one another so as to mesh with and be driven by the teeth of the ring gear 26 as shown in FIGS. 2 and 3.

The ring gear 26 as shown in FIG. 2, is held firmly in place so as not to interfere with the D'Arsonval movement which it surrounds by means of a set of bushings 30 which are attached to the printed circuit board 22 to permit the internal circumference 31 of the ring gear 26 to slide freely over the outer surface of the bushings 30 effecting rotation of the ring gear 26.

The drive gear 24 is rotatably mounted on the printed circuit board 22 to permit the teeth 27 of the drive gear 24 to mesh with the teeth of the ring gear 26 as shown in FIG. 2. The drive gear 24 is directly and fixedly attached to a thumb knob 20 which protrudes through the upper part of the housing 10 so as to be readily accessible for manual rotation by means of the motion of an operator's thumb.

The printed circuit board 22 is supported in the housing 10 to create an area directly beneath it suitable for storage of a power source preferably a battery 42 as shown in FIG. 3.

In operation, the operator manually rotates the thumb knob 20 which rotates the drive gear which in turn causes the ring gear 26 to rotate about the set of bushings 30. As the ring gear 26 rotates, it drives the five display wheels 36 causing them to rotate about their respective connecting means 40 resulting in the display through the five display windows 14 of the imprinted numerals 38 representing a desired range of a scale and the concomitant masking, under the meter face plate, of those numerals 38 representing an undesired range of a scale. The numerals 38 appearing through the windows 14 appear to be arranged in an arcuate configuration 16 so as to be easily, clearly, and accurately read in conformance with the motion of the pointer 18 of the D'Arsonval movement 28 thereby eliminating the parallax error associated with prior art meters and minimizing error due to operator confusion associated with a cluttered meter face.

Figure 4:
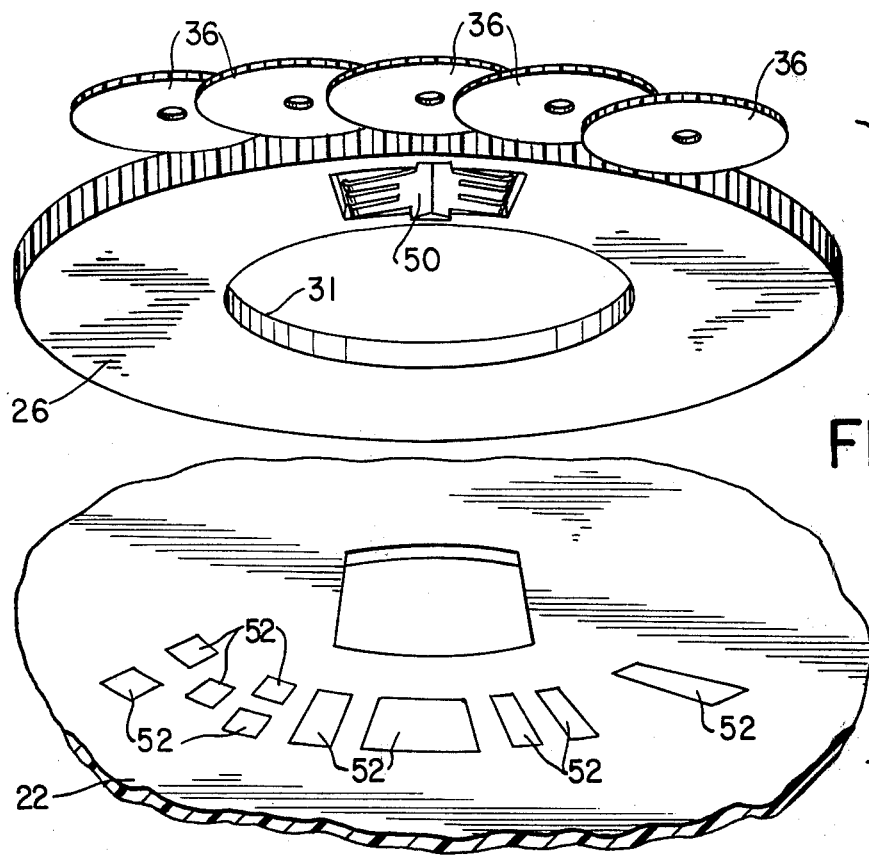
FIG. 4 is an exploded diagrammatic view of another embodiment of the invention.

Alternatively, the lower portion of the ring gear 26 as shown in FIG. 4 may be provided with a metal contact 50 which extends beneath the ring gear 26 so as to communicate with a plurality of electrical contacts 52 arranged on the printed circuit board 22 to permit the simultaneous automatic adjustment of both the desired scale, visible through the windows 14 as depicted in FIG. 1, and the appropriate related electrical circuit which controls the D'Arsonval movement 28.

The embodiments of the present invention hereabove described have the specific advantage of providing a greater range of scales, facilitating automatic complex electrical circuit switching while simultaneously eliminating operator reading error by providing an uncluttered meter face appearance in a meter designed for portable hand-held operation. While the invention has been particularly shown and described with reference to the embodiments thereof, it will be understood by those skilled in the art that various changes in form and details may be made therein without departing from the spirit and scope of the invention.

I claim:

1. Apparatus for adjusting a selected meter scale of pointer-type meters for uncluttered readout comprising:
   (a) a housing;
   (b) a meter plate supported by said housing having a plurality of display windows arranged in an arcuate configuration;
   (c) a plurality of geared display wheels mounted in non-engageable relation with each other and imprinted with scale numerals arranged about each display wheel face enabling the numerals to be brought into register with the windows on the meter plate to permit arcuate readout of the selected meter scale;
   (d) a ring gear rotatably mounted for simultaneous engagement of the display gears;
   (e) a drive gear rotatably mounted for engaging the ring gear whereby rotation of the drive gear rotates the ring gear causing rotation of the display gears whereby a desired meter scale is set and can be read through the windows on the meter plate; and
   (f) means for rotating the drive gear.

2. Apparatus as defined in claim 1 wherein five display wheels are arranged in non-engageable relation about the circumference of the ring gear.

3. Apparatus as defined in claim 2 wherein said means for rotating the drive gear consists of a thumb knob for manual rotation.

4. Apparatus as defined in claim 3 further comprising:
   (g) means for electrical switching for variable scale readout whereby a set of metal contacts on the ring gear communicate with a prescribed set of electrical contacts on a printed circuit board and wherein rotation of said drive gear causes simultaneous activation of the electrical switching means.

5. Apparatus for adjusting a scale of pointer-type meters for uncluttered readout comprising:
   (a) a housing;
   (b) a meter plate supported by said housing with a plurality of display windows arranged in an arcuate configuration;
   (c) a plurality of geared display wheels mounted in non-engageable relation with each other and imprinted with scale numerals arranged about each display wheel face enabling the numerals to be brought into register with the windows on the meter plate to permit arcuate readout of a selected meter scale;
   (d) a ring gear rotatably mounted for simulataneous engagement of the display wheels;
   (e) means for electrical switching for variable scale readout whereby a set of contacts on the ring gear contact a predescribed set of contacts on a printed circuit board;
   (f) a drive gear rotatably mounted for engaging the ring gear whereby rotation of the drive gear rotates the ring gear simultaneously causing
      (1) activation of the electrical switching means, and
      (2) rotation of the display wheels whereby desired meter scales are set and can be read through the windows on the meter plate, and
   (g) means for rotating the drive gear.

* * * * *